(12) United States Patent
Farris et al.

(10) Patent No.: US 7,298,153 B2
(45) Date of Patent: Nov. 20, 2007

(54) ECCENTRIC OFFSET KELVIN PROBE

(75) Inventors: Jason W. Farris, Parkville, MO (US); William E. Thurston, Kansas City, MO (US)

(73) Assignee: Interconnect Devices, Inc., St. Davids, PA (US)

( * ) Notice: Subject to any disclaimer, the term of this patent is extended or adjusted under 35 U.S.C. 154(b) by 0 days.

(21) Appl. No.: 11/137,187

(22) Filed: May 25, 2005

(65) Prior Publication Data

US 2006/0267601 A1    Nov. 30, 2006

(51) Int. Cl.
*G01R 31/02* (2006.01)
(52) U.S. Cl. .................................... 324/754
(58) Field of Classification Search ........... 324/754, 324/765, 158.1, 761–762, 760
See application file for complete search history.

(56) References Cited

U.S. PATENT DOCUMENTS

| | | | |
|---|---|---|---|
| 4,659,987 A * | 4/1987 | Coe et al. ................. | 324/754 |
| 4,721,903 A | 1/1988 | Harsch et al. | |
| 5,416,428 A | 5/1995 | Swart | |
| 5,557,213 A * | 9/1996 | Reuter et al. ............. | 324/761 |
| 5,781,023 A * | 7/1998 | Swart et al. .............. | 324/761 |
| 6,097,196 A | 8/2000 | Verkuil et al. | |
| 6,225,817 B1 * | 5/2001 | Sayre et al. .............. | 324/754 |
| 6,384,614 B1 | 5/2002 | Hager et al. | |
| 6,400,166 B2 | 6/2002 | Babson et al. | |
| 6,447,328 B1 | 9/2002 | Feldman | |
| 6,570,399 B2 * | 5/2003 | Yeghiayan et al. ........ | 324/761 |
| 6,685,492 B2 * | 2/2004 | Winter et al. ............. | 439/219 |
| 6,768,327 B2 * | 7/2004 | Felici et al. ............... | 324/754 |
| 6,831,452 B2 * | 12/2004 | McTigue ................... | 324/72.5 |

* cited by examiner

*Primary Examiner*—Ha Tran Nguyen
*Assistant Examiner*—Tung X. Nguyen
(74) *Attorney, Agent, or Firm*—Pepper Hamilton LLP

(57) ABSTRACT

An eccentric offset Kelvin probe with a beveled contact tip radially offset from the longitudinal axis of the probe which provides a reduced tip spacing between adjacent pairs of probes.

4 Claims, 1 Drawing Sheet

ECCENTRIC OFFSET KELVIN PROBE

FIELD OF THE INVENTION

The present invention relates to contact probes and, more particularly, to Kelvin probes for testing the resistance between two points of a device under test.

As electronic devices become smaller and smaller it becomes increasingly difficult to automatically test a device with test probes. Probes may be miniaturized to the same scale as the device under test in order to contact the device leads. However, it is often difficult to produce a reliable probe that can withstand the rigors of use in an automated test fixture. Very small test probes have a limited spring force and thus may not adequately penetrate the oxide layer of a device under test to make a good electrical connection. A good electrical contact is especially important for Kelvin probes which test the resistance between two points on a device under test.

In the specific application of testing low resistance or precision components such as power devices, precision resistors and sensitive analog amplifiers, the contact resistance of the probe itself can interfere with the measurement. In these situations, it is conventional to use a technique referred to as either Kelvin measurement or four point measurements. This technique requires that two independent probes contact the same pad, which means the effective pitch between probes must be half that of the pads they are contacting. This places a significant challenge on the probing technology.

SUMMARY OF THE INVENTION

The present invention provides a Kelvin probe which includes a barrel, a plunger, which is biased outwardly from one end of the barrel by a spring, and a contact with a needle extending from the other end of the barrel. The needle has an eccentric shaft extending from the contact and an offset beveled tip.

DETAILED DESCRIPTION

Figure 1:
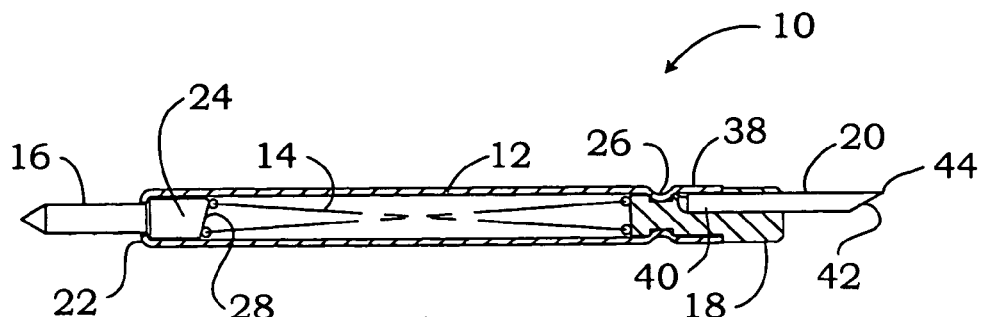
FIG. 1 is an enlarged cross sectional view of a probe of the present invention.

Referring to FIG. 1, a probe of the present invention is generally indicated by reference numeral 10. Probe 10 includes a barrel 12, a spring 14, a plunger 16, a contact 18 and a needle 20.

Barrel 12 provides a housing for spring 14 and guides the plunger 16. Probe 10 is an interposer housed in a socket without a receptacle. Barrel 12 may include a crimp 22 at one end to retain a tail 24 of plunger 16, and a crimp 26 near the opposite end to secure contact 18, for example. It should be understood that other methods of retaining the plunger 16 and contact 18 may be used. The contact 18 and needle 20 may be a one-piece design machined or cast from a single piece of material and inserted into the end of a barrel, or the barrel 12, contact 18, and needle 20 may be a one-piece design from a solid piece of cylindrical stock material back drilled to form the barrel 18 and with the contact 18 and needle machined from the other end of the stock material, for example. Although the probe 10 is illustrated with separate parts assembled together, it should be understood that these parts may be combined or manufactured in many different ways.

The plunger tail 24 provides a secondary point of electrical contact between the plunger 16 and the inside diameter of barrel 12. Plunger tail 24 may include a beveled contact end 28 which translates the axial spring force of spring 14 into a lateral force to urge the plunger tail 24 against the inside diameter of the barrel 12.

Barrel 12 may be made of gold plated phosphor bronze, a copper, nickel or zinc alloy, or other appropriate material, and may be made in a wide variety of lengths and diameters. For example, the barrel 12 may range in size from 2.54 mm or less in length with an outside diameter of 0.39 mm or less to more than 7 cm long with an outside diameter of 6.35 mm.

Spring 14 is generally helical to maintain a consistent counterforce to the plunger 16. Spring 14 may be made of gold plated steel with a spring force determined by the application. Plunger 16 may be made of beryllium copper, tool steel or stainless steel, for example, and plated with gold or nickel.

Figure 2:
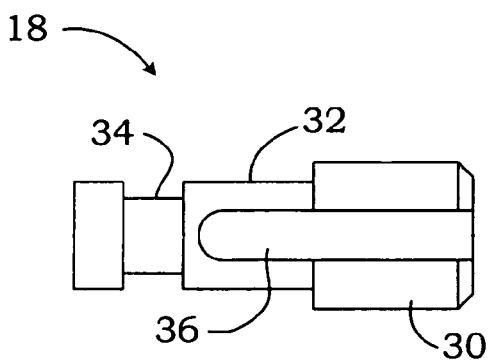
FIG. 2 is an enlarged plan view of the contact end of the probe of FIG. 1.
Figure 4:
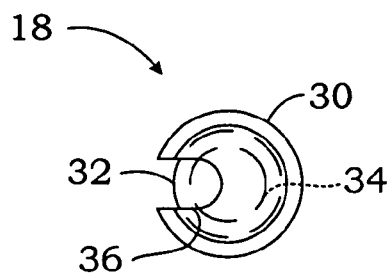
FIG. 4 is a right end view of the contact end of FIG. 2.
Figure 3:
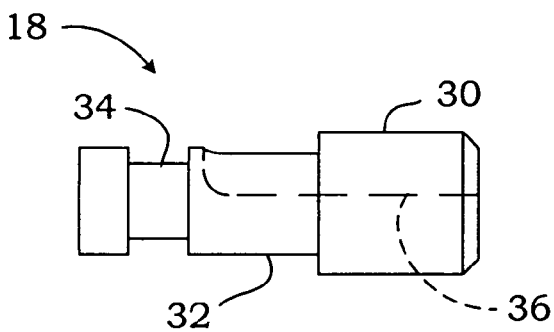
FIG. 3 is the contact end of FIG. 2 rotated ninety degrees.

Referring to FIGS. 2–4, contact 18 includes a head 30 and a neck 32. The diameter of head 30 is generally equal to the outside diameter of barrel 12. Neck 32 is slip fit into the end of barrel 12 and includes an annular groove 34. Crimp 26 is aligned with the annular groove 34 to secure contact 18 in place and to ensure good electrical contact between contact 18 and barrel 12.

Head 30 of contact 18 includes an axially-aligned groove 36, offset from the longitudinal axis of probe 10, into which tip 20 may be press fit. Alternatively, head 30 may include an axially-aligned aperture (not shown), offset from the longitudinal axis of probe 10, into which tip 20 may be pressed, for example. Additionally, contact 18 and needle 20 may be machined or molded as a single element.

Figure 5:
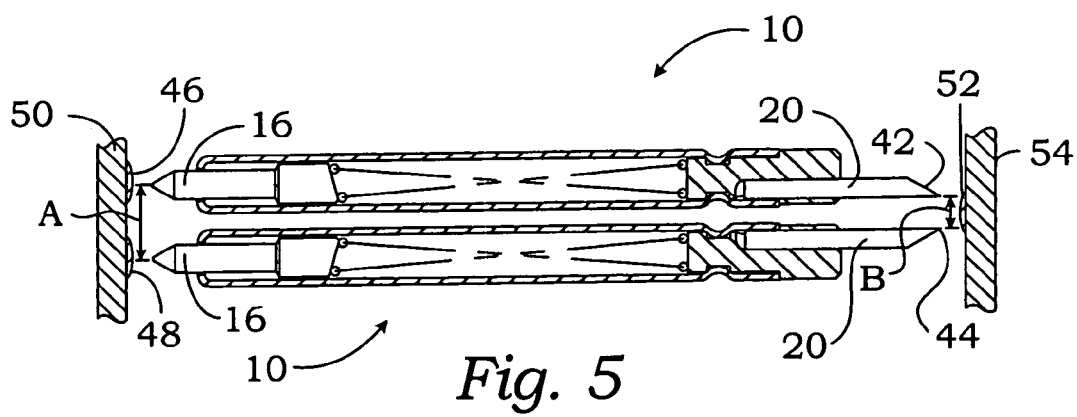
FIG. 5 is a pair of probes of FIG. 1.

Referring to FIGS. 1 and 5, when the tip 20 is inserted into the groove 36, the longitudinal axis of the tip 20 is offset from the longitudinal axis of the probe 10. The contact end 38 of barrel 12 extends over the tail 40 of tip 20 to secure tip 20 in place. Tip 20 includes a beveled end 42 and contact tip 44 which is angled toward the outer periphery of the head 30 and away from the longitudinal axis of the probe 10. Tip 20 may be approximately 0.127 mm in diameter with a longitudinal axis spaced approximately 0.087 mm from the longitudinal axis of the probe 10.

When a pair of Kelvin probes 10 are mounted in a socket (not shown) the center-to-center spacing A of the adjacent probes is approximately 0.5 mm. Plunger tips 16 separately contact pads 46 and 48 on fixture 50. The spacing B between the needle tips 44 of each needle 20 is approximately 0.1 mm to 0.3 mm or twenty to sixty percent of the center-to-center spacing A, for example. Because of the needles 20 are offset from the longitudinal axis of the respective probe 10, and the ends are beveled 42, the needle tips 44 of adjacent probes 10 may contact the same pad 52 on the device under test 54. Pad 52 is the same size as pads 46 and 48. Thus, a larger diameter probe with better electrical characteristics than a smaller probe may be used. Additionally, a larger probe may last longer and include a stronger spring to ensure adequate contact with the device under test.

In the use of Kelvin probing, two independent probes make contact to the same pad. Two pairs of probes are used to measure the resistance between two pads on a device under test. This technique eliminates the series resistance of the probes and any contact resistances of the tips to the pads. It is a precision measurement of the resistance between the two pads, due to the device that is connected.

In this technique, one of the pair of probes on each pad is selected as the current force. A controlled amount of current I, is forced through the two pads, typically ranging from 1 mA to 1 A, using either a constant current power supply, or just a constant voltage supply and measuring the current. If the contact resistance changes, the current will either be kept constant, or the change in current measured.

The second probe on each pad is used to measure the voltage drop, V, between the two pads. Since this is a high impedance measurement, there is little current flowing through the probes and the measured voltage is unaffected by the probe contact resistance. By independently measuring the current through the pads and the voltage across them, the resistance between the pads can be measured as V/I, independent of the probe resistance or contact resistance.

However, this technique requires two independent probes to contact each pad, which requires a tighter pitch than if only 1 probe were to contact each pad. This tighter pitch is accomplished by the close tip spacing B of the probes 10.

It is to be understood that while certain forms of this invention have been illustrated and described, is it not limited thereto except insofar as such limitations are included in the following claims.

The invention claimed is:

1. An assembly for testing of electrical components, said assembly comprising:
   a pair of spaced apart Kelvin probes, each of said Kelvin probes comprising:
      a plunger having a tip and an end portion opposite said tip,
      a barrel for receiving said end portion of said plunger for movement of said plunger along a first longitudinal axis between an extended position where said tip projects from said barrel and a retracted position where said tip partially retracts within said barrel,
      a spring within said barrel for biasing said plunger outwardly from said barrel, and
      a contact having a base and a needle extending from said base,
      said base secured within said barrel opposite said plunger,
      said needle having a second longitudinal axis generally parallel to said first longitudinal axis, and a beveled tip, and
   a socket for receiving said pair of Kelvin probes and securing said Kelvin probes whereas said first longitudinal axes of said pair of Kelvin probes are generally parallel,
   whereas the distance between said beveled tips is less than the distance between said plunger tips of said pair of Kelvin probes.

2. The assembly as set forth in claim 1 wherein said beveled tip is angled away from said first longitudinal axis.

3. The assembly as set forth in claim 1 wherein the distance between said beveled tips is approximately twenty to sixty percent of the distance between said plunger tips.

4. The assembly as set forth in claim 1 wherein the distance between said beveled tips is approximately 0.1 millimeter to 0.3 millimeter.

* * * * *